(12) United States Patent
Tuymer et al.

(10) Patent No.: US 8,025,775 B2
(45) Date of Patent: *Sep. 27, 2011

(54) VACUUM PLASMA GENERATOR (75) Inventors: Gerhard Tuymer, Bad Schallerbach (AT); Andreas Schutze, Feldkirch (AT)

(73) Assignee: Oerlikon Trading AG, Truebbach, Truebbach (CH)

( * ) Notice: Subject to any disclaimer, the term of this patent is extended or adjusted under 35 U.S.C. 154(b) by 1018 days.

This patent is subject to a terminal disclaimer.

(21) Appl. No.: 10/507,095

(22) PCT Filed: Feb. 19, 2003

(86) PCT No.: PCT/CH03/00121
§ 371 (c)(1),
(2), (4) Date: Sep. 3, 2004

(87) PCT Pub. No.: WO03/079397
PCT Pub. Date: Sep. 25, 2003

(65) Prior Publication Data
US 2005/0098430 A1    May 12, 2005

(30) Foreign Application Priority Data
Mar. 15, 2002  (CH) .................................. 458/02

(51) Int. Cl.
| C23C 14/00 | (2006.01) |
| C23C 14/32 | (2006.01) |
| C25B 9/00 | (2006.01) |
| C25B 11/00 | (2006.01) |
| C25B 13/00 | (2006.01) |
| H01J 7/24 | (2006.01) |
| H05B 31/26 | (2006.01) |
| H05B 41/16 | (2006.01) |
| H05B 41/24 | (2006.01) |
| H02M 7/00 | (2006.01) |

(52) U.S. Cl. .......... 204/192.12; 204/192.22; 204/298.08; 315/111.21; 315/247; 315/282; 363/124; 363/125

(58) Field of Classification Search ............. 204/298.34, 204/192.12, 192.22, 298.08; 219/121.54; 250/504 R; 315/248, 111.21, 247, 282; 327/427; 363/17, 63, 98, 124, 125; 422/186.29; 427/255.28, 427/577

See application file for complete search history.

(56) References Cited

U.S. PATENT DOCUMENTS
4,600,563 A * 7/1986 Diederich ................ 422/186.29
(Continued)

OTHER PUBLICATIONS
http://www.ptb-sales.com/vacuum/source/temescal/cl-2a.jpg [Accessed on Feb. 26, 2008].*
(Continued)

*Primary Examiner* — Alexa Neckel
*Assistant Examiner* — Michael Band
(74) *Attorney, Agent, or Firm* — Notaro, Michalos & Zaccaria P.C.

(57) ABSTRACT

A vacuum plasma generator with an output for feeding a plasma discharge for treatment of workpieces in a vacuum chamber has a connection for the junction to AC voltage mains, a rectifier connected to a converter with a control input for the setting and/or regulation of the converter output voltage, and a controlled full bridge circuit connected to the converter output with a potential-free generator output, which transposes the converter output voltage into pulses of 1 to 500 kHz. A potential-isolating transformer is switched into the bridge for the galvanic decoupling of the generator output.

20 Claims, 11 Drawing Sheets

U.S. PATENT DOCUMENTS

| | | | |
|---|---|---|---|
| 4,780,803 A * | 10/1988 | Dede Garcia-Santamaria | 363/98 |
| 4,877,999 A * | 10/1989 | Knapp et al. | 315/248 |
| 4,891,118 A * | 1/1990 | Ooiwa et al. | 204/298.34 |
| 5,026,471 A * | 6/1991 | Latz et al. | 204/298.19 |
| 5,303,139 A * | 4/1994 | Mark | 363/63 |
| 5,418,707 A * | 5/1995 | Shimer et al. | 363/65 |
| 5,464,667 A * | 11/1995 | Kohler et al. | 427/577 |
| 5,591,486 A * | 1/1997 | Okano et al. | 427/255.28 |
| 5,709,784 A | 1/1998 | Braendle | |
| 5,993,613 A * | 11/1999 | Manley | 204/192.12 |
| 6,005,218 A * | 12/1999 | Walde et al. | 219/121.54 |
| 6,107,860 A * | 8/2000 | Vinciarelli | 327/427 |
| 6,296,742 B1 * | 10/2001 | Kouznetsov | 204/192.12 |
| 6,340,416 B1 * | 1/2002 | Goedicke et al. | 204/192.12 |
| 6,815,700 B2 * | 11/2004 | Melnychuk et al. | 250/504 R |
| 7,455,755 B2 * | 11/2008 | Tuymer et al. | 204/298.08 |
| 2002/0012254 A1 * | 1/2002 | Raets et al. | 363/17 |

OTHER PUBLICATIONS http://en.wikipedia.org/wiki/Bridge_circuit [Accessed on Feb. 26, 2008].* http://en.wikipedia.org/wiki/Transformer [Accessed on Feb. 26, 2008].*

Ned Mohan, Tore M. Undeland, William P. Robbins; Power Electronics: Converters, Applications, and Design, Second Edition; 1989; 178-179; John Wiley & Sons, Inc.; New York, US.

* cited by examiner

VACUUM PLASMA GENERATOR

This application is a 371 of PCT/CH03/00121 filed Feb. 19, 2003, and also claims benefit of Swiss Patent Application No. 458/02, filed Mar. 15, 2002.

FIELD AND BACKGROUND OF THE INVENTION

The invention relates to a vacuum plasma generator for feeding a plasma discharge for the purpose of treatment of workpieces in a vacuum chamber according to the claims, as well as a method for the production of a layer by reactive deposition out of a plasma.

Electrical feeding devices for operating gas discharges or plasma discharges for vacuum processes have already become variously known. Such electrical feeding devices are also known as generators in the technical world. It is important here to be able to exercise good control over the operating conditions, since the nature of the plasma discharge and the plasma process tied thereto make special demands. Apart from the voltage input, the current and the discharge power, the behavior during flash-overs in the plasma, also denoted as arcs, as well as possible shortcircuits must be especially well controlled. Such arc discharges, or arcs, occur repeatedly during the operation of plasma discharges and require special measures. In particular when coating with the aid of a sputtering process, also denoted as sputtering, such flash-overs occur and can negatively affect the quality of the product or even make coating impossible. Such problems occur especially severely if poorly conducting layers or even dielectric layers are to be generated. To deposit such layers, for example by means of magnetron sputtering, the so-called reactive sputtering is preferably employed. Herein, for example, the target of a magnetron source is supplied with negative DC voltage to attain a so-called DC plasma, which is maintained for example with a carrier gas such as argon, and the ionized argon particles sputter the target with the aid of an impact process. The sputter target is here developed metallically, thus is a conductive material, and during the sputtering is brought to reaction with additive reactive gas, for example oxygen, whereby subsequently an oxidic layer can be deposited. Due to the covering of the surrounding surfaces, but also of the target itself, with the oxidic layer, arc problems are herein encountered. The nonconducting coated surfaces become charged during the DC sputtering process and the undesirable arc discharges are generated.

Until now attempts at alleviating the problem have included, for example, detecting such arcs and subsequently briefly switching off the generator in order to run up the plasma again. Another known solution comprises carrying out high-frequency discharges in the MHz range or medium frequency discharges in the kHz range or superimpositions of such AC voltages with respect to a DC basic discharge. A further known possibility includes feeding the plasma during reactive sputtering processes with the aid of a DC pulsed generator. The AC voltage component contained in the pulse feeding, also referred to as AC component, and/or the pulse interspaces make possible the periodic discharge of the undesired charging in the vacuum space. Since the dielectric, respectively nonconducting, layers in these reactive processes are relatively thin, for example in the micrometer range or less, relatively low frequencies in the kilohertz range are sufficient for this purpose. Such DC-pulsed configurations are denoted as unipolar pulse configurations. In order to further advance the discharge process on these dielectric layers, it is helpful if the electrode during the interspace time is not only switched free of the feeding but rather is shortcircuited relative to the anode or ground. Hereby the discharge process is purposefully positively affected. Further acceleration of the discharge process can be attained if in the interspace time, which means when no argon ions are accelerated with the negative pulse toward the target, even to switch the voltage briefly into the positive range in order to generate a greater discharge gradient for electrons and to accelerate the discharge process once more. Consequently bipolar pulses are already employed here, however these preferably not being symmetric and the negative pulse time area being greater than the positive one in order to ensure high sputter rates. Typical discharge voltages in magnetron sputter configurations are within the range of a few hundred volts, typically approximately in the range from negative 400 to 800 volts. Depending on the layout of the magnetron source and the operating pressures, the voltage ranges can also be wider or narrower. For the accelerated discharge of dielectric chargings it is here sufficient to move briefly in the interspace time to a few volts or some ten volts positive.

Known furthermore is also the possibility of operating two electrodes as cathodes, where these are alternately switched cathodically and the other time anodically, meaning they are operated with a bipolar pulse generator. This configuration has also been referred to as Twin Mag. Herein, each electrode is alternately once the cathode and subsequently the anode. This is an especially advantageous configuration for reactive sputtering processes. Compared to the known high frequency-controlled AC plasma configurations, the unipolarly or bipolarly operated DC-clocked DC configurations have the advantage of high rates. The complicated reactive process, in addition, can be better controlled. Modern generators of this type are realized as controllable DC generators, where in particular the switched mode power supply technique, also known as DC voltage converter or known in English as switched mode power supply or converter configurations, have become known. As is customary in electronics, switched-mode power supplies of this type are structured such that first the AC voltage mains, for example the three-phase mains with 3×400 V AC 50 Hz is rectified in conventional manner to generate a DC voltage. The generated DC voltage down from the mains in this case is approximately 550 V and is subsequently converted with the aid of a switched-mode power supply or a so-called DC-DC converter to the desired voltage values. For this purpose the DC voltage is essentially chopped under control with the aid of semiconductor switches and via a transformer correspondingly step-transformed up or stepped-down, and the configuration can conventionally be controlled, for example in terms of pulse width, via the semiconductor switches in order to be able to generate a variably settable output voltage. It is understood that the configuration can also be regulated to the correspondingly desired output voltages, currents or powers.

Such switched-mode power supplies or DC-DC converters have become known as various types and by now there are many variation forms of implementation possibilities. For operating a plasma generator with unipolar starting pulses for the plasma feeding, such DC-DC converters are employed directly by controlling or clocking these at the primary side via switching transistors and at the output side a corresponding pulsing DC voltage is generated. In the case of higher powers and for the generation of bipolar output pulses, the use of semiconductor bridge circuits, as with transistors or thyristors, has become pervasive. In this case the bridge is utilized in known manner for the purpose of inverting the polarity of the DC voltage fed into the bridge. The load or the plasma discharge path is here always switched directly into the semiconductor bridge branch. Expenditures for the realization of these known configurations is considerable. Especially with respect to protective measures of the semiconductors at the high operating voltages and especially also at high powers, special protective measures are required for the semiconductors. A further problem consists therein that in the event of flash-overs or shortcircuits fast transient processes take place, which lead to induced voltage superelevations and to high current peaks, which can additionally destroy the sensitive power semiconductors. Operation with reactive processes, in particular with poorly conducting materials or even insulation layers at high powers or at high pulse powers, and especially with defined pulse rise times, has until now only yielded limited success with the known pulse generators.

SUMMARY OF THE INVENTION

The aim of the present invention comprises eliminating the above described disadvantages of prior art. The aim in particular comprises realizing a vacuum plasma generator which can withstand high powers in continual operation and simultaneously is capable of transferring to the plasma defined pulse behavior in order to be also able to realize therewith the desired layer properties. For it was found that the deposition of layers with specific required properties depends strongly on the manner of the pulse feeding of the plasma and, consequently, of the plasma discharge behavior.

This problem is solved according to the invention through a vacuum plasma generator and through a method. The dependent claims define further advantageous embodiments.

The problem is solved according to the invention thereby that a vacuum plasma generator with an output for feeding a plasma discharge for the treatment of workpieces in a vacuum chamber is structured such, that a mains supply for the junction to an AC voltage mains is provided, where this [junction] includes a power rectifier for generating a DC voltage and a DC-DC converter succeeds it [the power rectifier] with a control input for setting and/or regulating the converter output voltage and to this converter [is connected] a controlled full-bridge circuit with a potential-free generator output, which transposes the converter output voltage into pulses of 1 to 500 kHz, and into the bridge is connected a potential-isolating transformer for the galvanic decoupling of the generator output.

The bridge circuit here comprises switching transistors, so-called IGBTs being preferably employed. Across the preceding DC-DC converter, the voltage fed into the bridge circuit can be set over a wide range. For this purpose a so-called clocked DC-DC converter, thus a switched-mode power supply, has been found to be useful, which is preferably realized as a buck-boost converter. The set output voltage can in this case be lower as well as also higher than the input voltage. The succeeding bridge circuit is thus only utilized for the generation of the pulsing output voltage. This [voltage] can be unipolar as well as preferably bipolar. According to the invention the plasma discharge path is not switched directly into the bridge, but rather across an isolating transformer directly switched into the bridge and developed as a low-leakage implementation. The task of this transformer is not primarily transforming the voltage, but rather to generate a potential isolation and simultaneously to avoid reactive effects onto the sensitive switch semiconductors in the bridge, thus also to decouple the plasma with respect to the bridge circuit. The transformation ratio of this transformer consequently should be maximally 1:2, but it is better if it is less than 1:1.5. The leakage inductance of the transformer should not be greater than 50 µH, but it is preferable to keep it below 10 µH. For this purpose special winding measures are necessary. Driving the bridge circuit advantageously takes place via an electronic control device, such as in particular a microprocessor driving, wherewith the setting and/or regulation of the pulse behavior becomes feasible. Thus, a bipolar pulse can be set, the switching frequency and the pulse-duty factor can be set. In addition, the pulse width and the setting of the pulse form can be affected. Additional capabilities of affecting the curve form comprise that the preceding converter suitably tuned is modulated or controlled.

For the reactive sputtering application it is important that in the present configuration between the pulses a pulse interspace can be set and in this pulse interspace the electrodes are shortcircuited via the transformer or the bridge circuit. This takes place by shortcircuiting the primary side of the transformer with the bridge.

In addition, the configuration of the generator according to the invention makes feasible operating several bridges at the converter in parallel and to join together the outputs of the bridges via a transformer or several transformers. Consequently, with the present configuration according to the invention it is feasible to conduct high pulse powers to the plasma without generating impermissible distortions of the pulse form, and consequently to control the plasma behavior and the reactive process such that especially well-defined crystalline results can be attained in the deposited layer. For this purpose very high pulse powers are also necessary, which can only be realized through the concept according to the invention without having to fear the destructions of sensitive semiconductor components on the generator. The generator according to the invention permits, in addition, the economic realization of the configuration.

The various features of novelty which characterize the invention are pointed out with particularity in the claims annexed to and forming a part of this disclosure, and are entirely based on the priority application, CH 458/02, filed Mar. 15, 2002 in Switzerland.

BRIEF DESCRIPTION OF THE DRAWINGS

In the following the invention will be explained in greater detail by example with schematic figures. In the drawing depict:

FIG. 3 a typical voltage and current curve trace of a bipolar pulse configuration, FIG. 4 a generator configuration according to the invention, FIG. 5 a structuring of the bridge circuit with two bridges, FIG. 6 switching states of the configuration according to FIG. 5, FIG. 7 a configuration according to the invention with two full bridges and two transformers, FIG. 8 a generator according to the invention with four full bridges and four transformers, FIG. 9 a transformer with winding diagram in cross section, FIG. 10 schematically and in cross section a coating installation with generator, FIG. 11 characteristic target current/oxygen flow for a reactive sputtering process according to the invention for the deposition of $Al_2O_3$, FIG. 12 X-ray diffraction spectrum for an $Al_2O_3$ layer with gamma structure.

DESCRIPTION OF THE PREFERRED EMBODIMENTS

Figure 1:
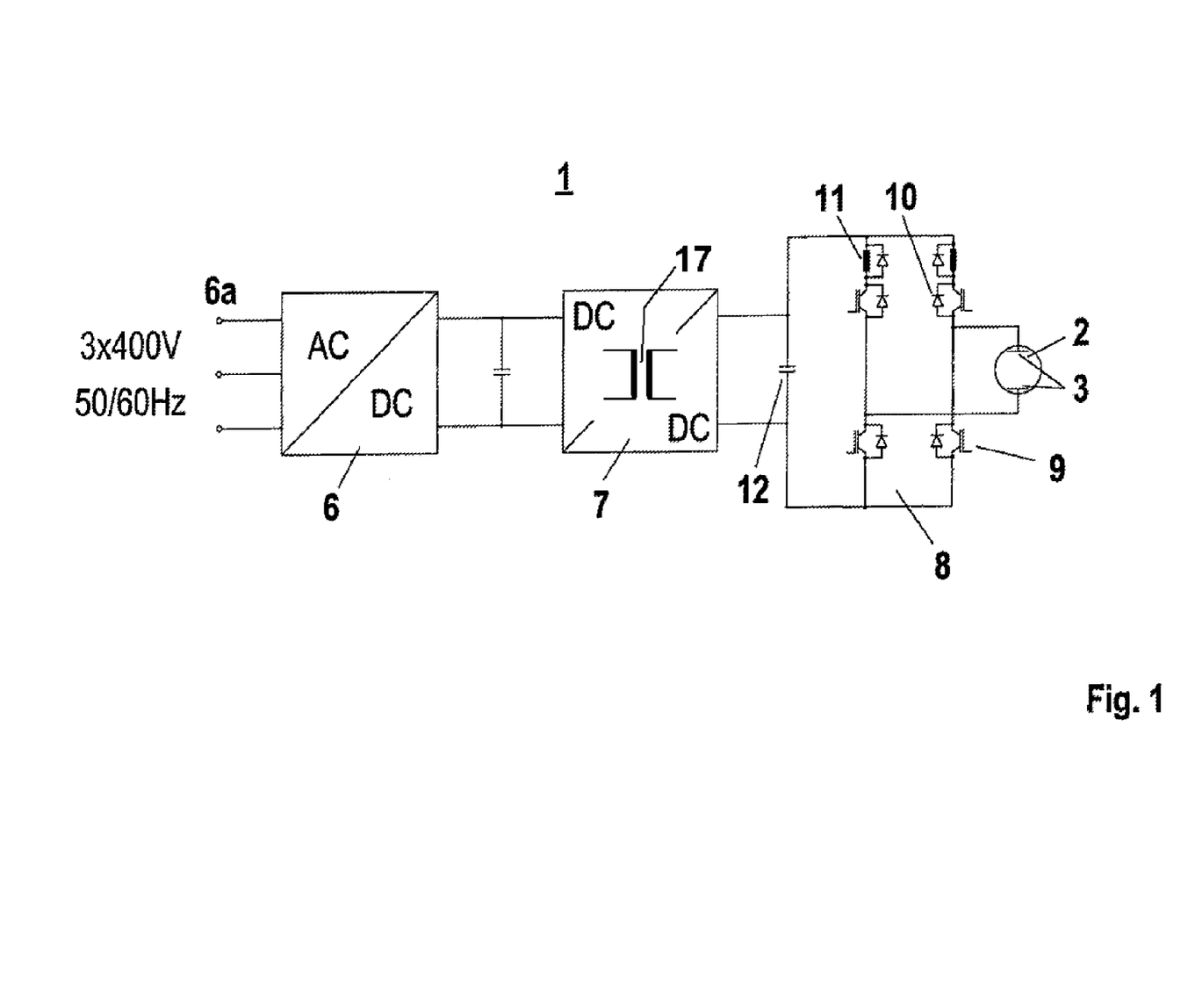
FIG. 1 a bipolar pulse generator according to prior art.

FIG. 1 depicts schematically the structure of a known generator 1, which, as is conventional, is connected at an input 6a to the AC voltage mains of 3×400 V AC 50 Hz. This generator comprises an input-side DC voltage power supply unit 6, 7, and the potential isolation from the supply mains, required in most applications, via a converter transformer 17 located in the DC-DC converter 7 of the DC voltage power supply. To generate pulsed unipolar as well as also bipolar output voltages, the known generators include a pulse output stage 8 fed from the DC voltage intermediate circuit 12, shown here as a capacitor. In the most unfavorable case this pulse output stage 8 is even spatially isolated from the DC voltage power supply 6, 7 in a separate housing. Essential components of the output stage 8 are electric switches such as transistors 9 and free-running diodes 10. Often inductors 11 are inserted into the switching circuit as additional protection. To generate bipolar pulses the output stage has a bridge structure, the bridge forming in all known generators the output directly, which means, the transistors formed directly with the load through the two electrodes 3 and the plasma ignited by these are electrically connected within one vacuum chamber 2.

Figure 2:
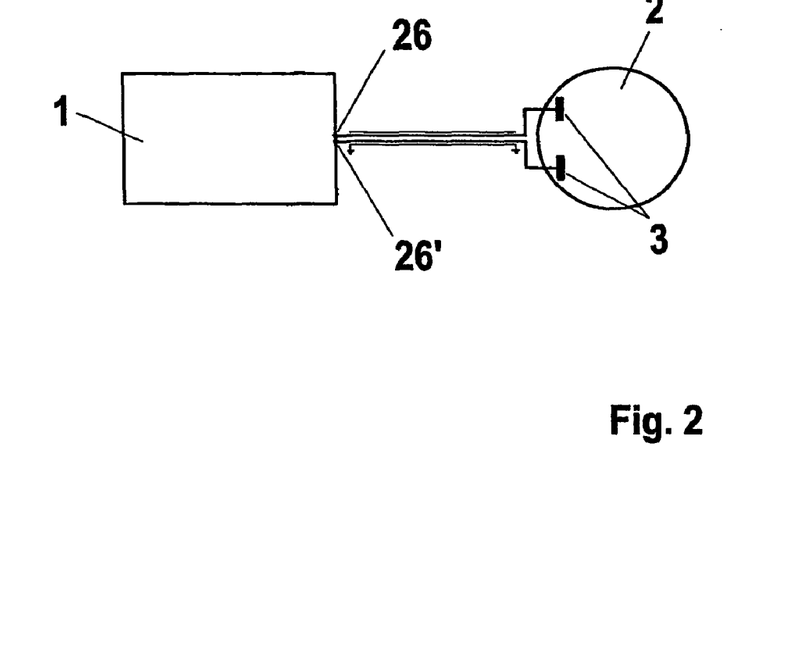
FIG. 2 a fundamental electrode configuration with generator.
Figure 3:
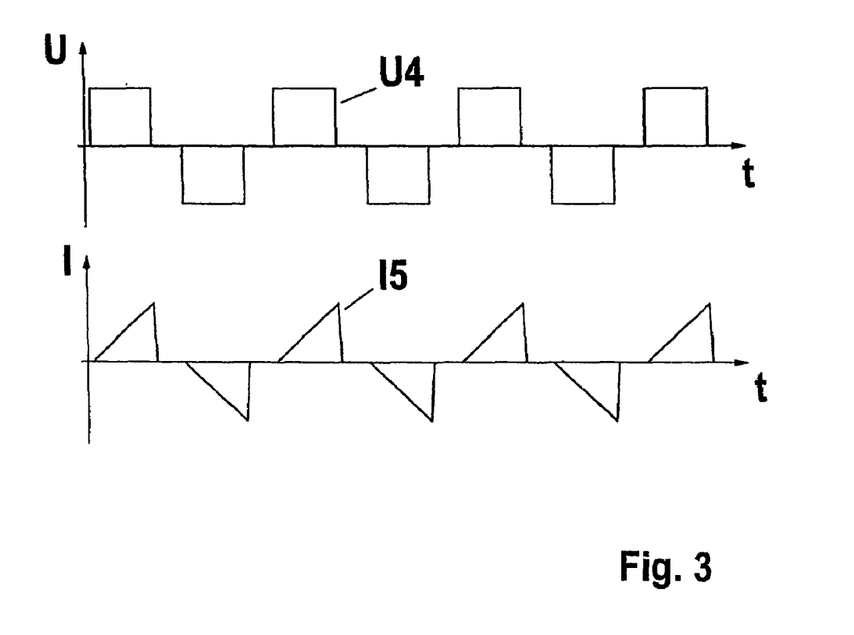

FIG. 2 shows schematically the preferred application case of the generator. The two outputs 26, 26' of the generator 1 are each connected with an electrically insulated electrode 3, preferably magnetron cathode, located within a vacuum chamber 2. In FIG. 3 the voltage pattern U4 and the current pattern 15 are preferably shown as a function of time t for an output 26, 26' of the generator 1. After each positive rectangular voltage pulse, an interspace follows, after which the electric polarity of the succeeding pulse reverses. The current I flowing across the plasma as well as the electrode 3 and the generator 1 follows an approximately triangular curve trace, since at the start of a pulse especially the number of the charge carriers present in the plasma as well as in an inductance at the output of the generator, such as for example the wiring inductance, output filter, etc., prevents a steeper rise of the current. While the one output follows the depicted pattern, at the other output and at the one target electrode the particular reversed polarity is applied. Consequently, a continuous charge exchange between the electrodes across the plasma takes place and prevents electric charging at the target surface.

Figure 4:
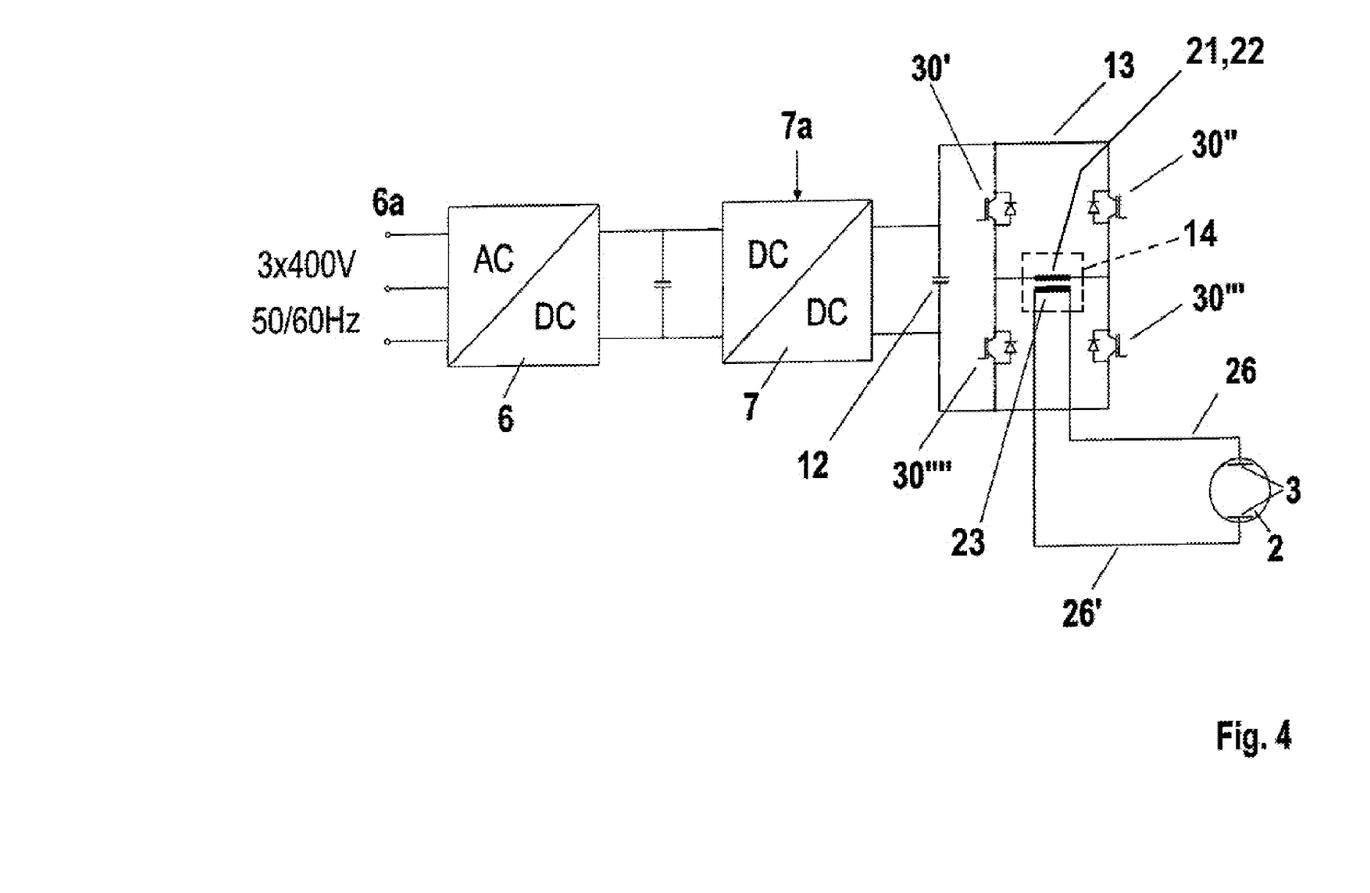

Essential for obtaining a generator functioning without damage even over a long time period during industrial application even functioning at several hundred kW peak powers and pulse frequencies in the range from 1 to 500 kHz, or preferably of 5 to 100 kHz, is the configuration according to the invention, as depicted in FIG. 4. The generator comprises a power connection 6a and an AC-DC mains rectifier 6, which converts the mains AC voltage into a DC voltage. At the conventional three-phase mains voltages of 3×400 V AC 50 Hz, at the mains rectifier output a DC voltage of approximately 550 V is generated, which can be additionally filtered free of ripple with capacitors. This DC voltage is now used to feed the DC-DC converter 7, which is capable of attaining a DC voltage, which is lower or higher than the voltage fed in. This converter 7 is comprised of a switched-mode power supply, which preferably is developed as a buck-boost converter, in order to attain the required properties as a low and high level-setter. Such buck-boost converters are described for example in "Power Electronics by Mohan, Undeland, Robbins, John Wiley & Sons, Inc., Second Edition 1995".

This technology makes possible, in addition, the use of several parallel operated buck-boost converters, which are each offset preferably by a specific phase with respect to the switching pulses, in order to reduce the ripple current loading in the succeeding intermediate circuit capacitor and in order to be able to operate with lower capacitance values. In addition, the loading of the individual converters is divided. A configuration with four such converters has in practice been found to be suitable, which are each connected offset by one fourth period. In the proposed structure according to the invention of converter 7, the far more widespread and tried IGBT modules can advantageously be employed as switches, which are capable of processing voltages up to 1200 V. It is readily feasible with this circuit configuration to provide already in the range of the DC-DC converter 7 the necessary power peaks, which are greater than 50 kW or can even be a few hundred kW.

At the output of the DC-DC converter 7 advantageously an intermediate circuit capacitor 12 follows as a smoothing capacitor. Converter 7 consequently provides the operating voltage required at the output and advantageously is provided with a corresponding control input 7a, through which the desired voltage can be set or regulated. It is understood that it is also feasible to regulate to a current or power, measured at the output, with the appropriate regulation electronics circuitry. Microprocessor circuits have been found to be useful for the processing of the corresponding control voltages. Following the intermediate circuit capacitor 12 of the converter 7 is connected a full bridge circuit 13 comprised of four semiconductor switches such as switching transistors 30' to 30''''. These switching transistors are also preferably IGBT transistors. Since a completely symmetric output structure of the components of the generator are advantageous depending on the application, in order to ensure the symmetric power driving of the electrodes and to minimize the disturbances due to the oscillation tendency of electrode voltage and plasma current, on the driving side of the transistors, the transformer 14 required for the potential isolation from the mains, in contrast to known generators, was disposed directly at the output of generator 1 as an essential function element in the present bridge configuration 13. This is feasible since in the present application the output voltage between the electrodes 3 in the preferred operating case is free of DC components, thus oscillates symmetrically about the voltage zero point. The switching transistors 30 of bridge circuit 13 are also specifically driven with the aid of a control electronics, preferably with a microprocessor electronics.

Figure 5:
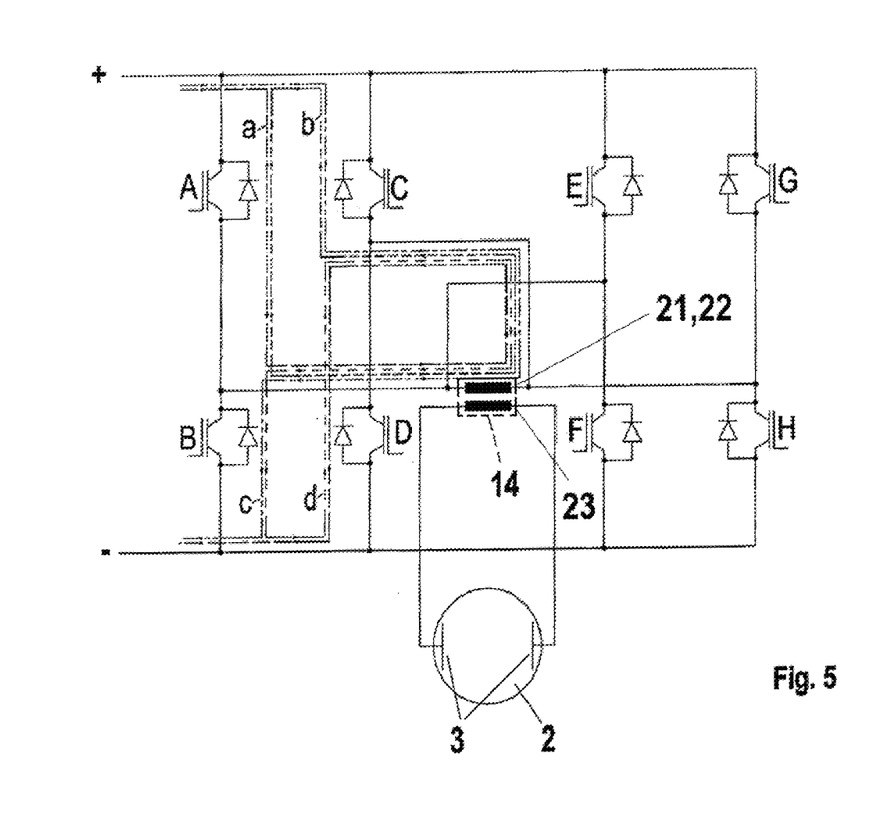

A further preferred embodiment of the configuration according to the invention is a circuit structure of the full bridge 13 according to FIG. 5, which, apart from a high output power, also makes possible a high output frequency. Here essentially two full bridges are operated in parallel at a single DC-DC converter output 7, the two bridge circuits here being preferably operated offset in time. When structuring a circuit in which only the minimally required number of transistors is used to set up a bipolar voltage pattern at output 26, 26' of generator 1, the output frequency is determined by the maximum switching frequency of each individual transistor. The maximum switching frequency of the transistors, thus the minimum time between switch-on processes, is critically demanded by the time which must pass until, for one, the thermal loading, due to the processes of switching on and switching off, as well as during the switch-on time of the transistor, has been reduced and, for another, the charge carriers in the switching circuits of the transistor have been reduced again. As a solution of this problem, due to the required output frequency, which due to the application is high, and the high switching currents, a higher switching frequency was attained at the output by not only utilizing a full bridge but advantageously two or several full bridges, which fundamentally are operated connected in parallel, but are switched offset in time, whereby a higher output switching frequency can be attained at the generator than must be provided by the individual transistors. By driving the transistors A to H with the associated current paths a to h according to FIG. 5 and according to the pattern of FIG. 6, the doubling or multiplication of the resulting output frequency between electrodes 3 at output 26, 26' of the generator is achieved compared to the switching frequency of the individual transistors A to H.

Figure 6:
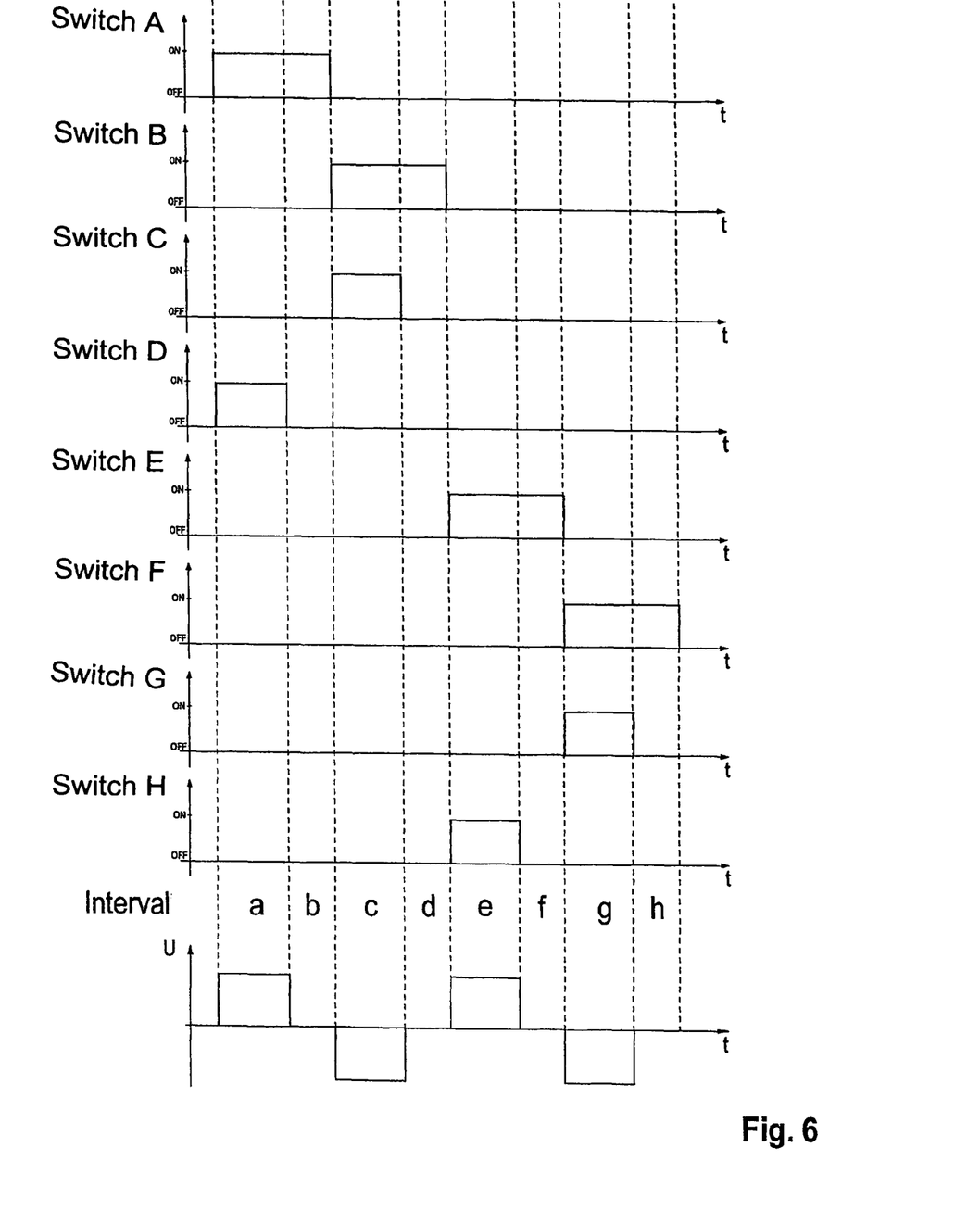

Through this measure it is feasible to obtain an output frequency resulting in dependence of the application, which is higher than the maximally attainable switching frequency of the transistors employed. FIGS. 5 and 6 depict the switching states of transistors A to H and the resulting current curve traces a to h for a switching cycle of all transistors and the resulting bipolar output pulse with interspaces. This corresponds to two periods of the output voltage of the generator. In interval a the transistors A and D switch on and current flows from the positive pole of the intermediate circuit across transistor A via the primary side of the transformer across transistor D into the negative pole of the intermediate circuit capacitors 12. During this phase, for example, a positive polarity is at once of the two outputs 26, 26' of the generator. During interval b the transistor D is now switched off and the current flow is reduced and flows across the free-running diode of transistor C and the transistor A which continues to be switched on. Furthermore, transistor A is also switched off and the two diagonally disposed transistors C and B are switched on, whereupon the current now flows opposite to the previously described transistor position through the primary side of the transformer 14 and at the two outputs of the generator 26, 26' the opposite polarity is setting up. As depicted in FIG. 6, the complete curve traces of intervals a to h yield two periods of potential change at the outputs of the generator. For a preferred embodiment of the generator, for generating a stable and quiet plasma, or for a plasma in which arcing is largely avoided, the two electrodes 3 connected at output 26, 26' are shortcircuited against one another during the pulse interspace. In the embodiment represented here switches remain intentionally switched on during the pulse interspace and a free running circuit is formed, via which the primary-side current is reduced. The electrodes are consequently shortcircuited via the secondary-side of the transformer 14.

Figure 7:
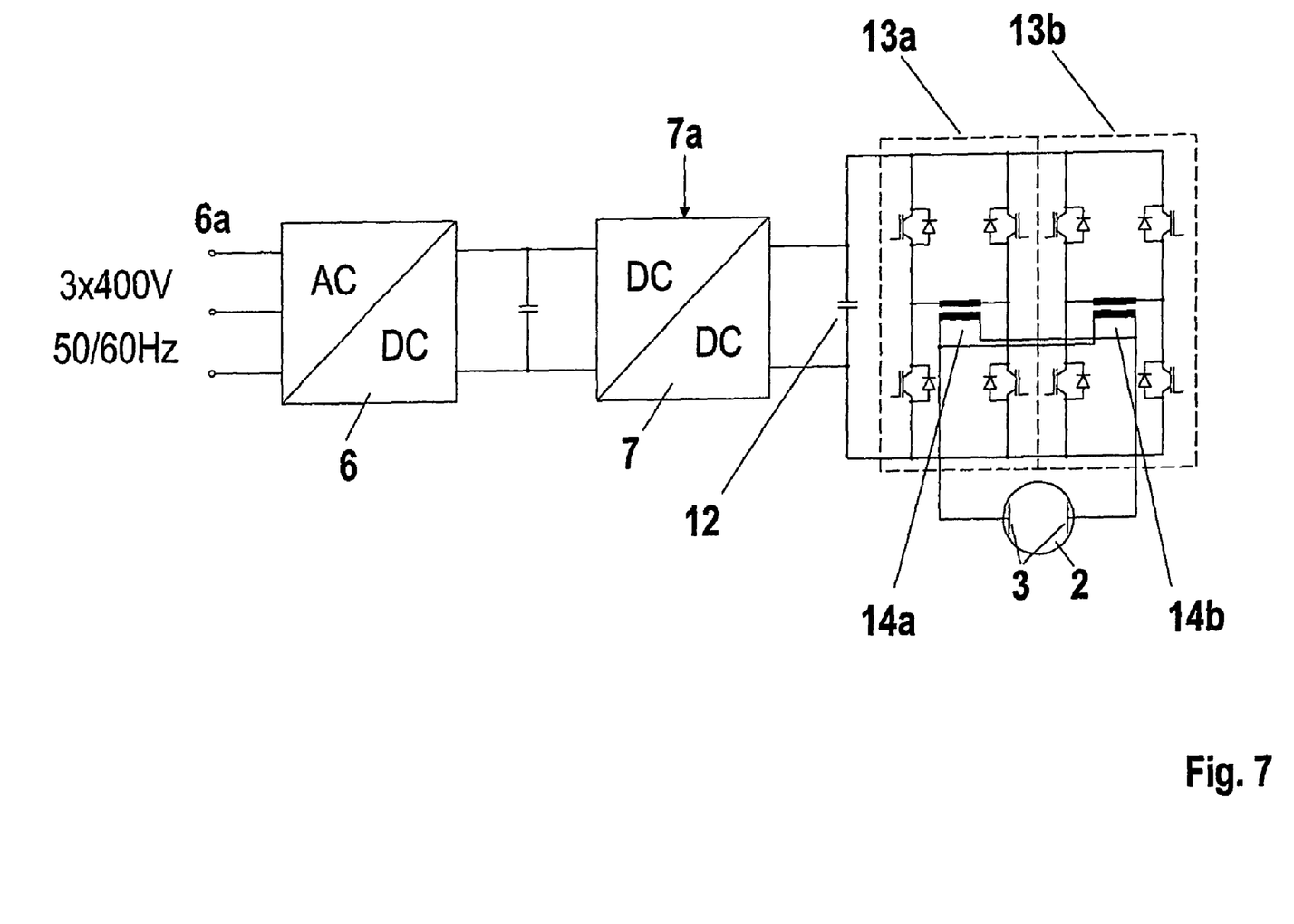

In the previously described circuit a single transformer 14 was used and the several bridge circuits at the primary side switched onto the one transformer 14. To make feasible a further power distribution and symmetrization onto the two transistor full bridges 13a, 13b or onto several full bridges, to each full bridge 13a, 13b, as shown in FIG. 7, a separate transformer 14 was assigned. The individual transformers 14a, 14b are connected parallel on the secondary side and guided to the output 26, 26' of the generator, where both electrodes 3 can be connected.

Figure 8:
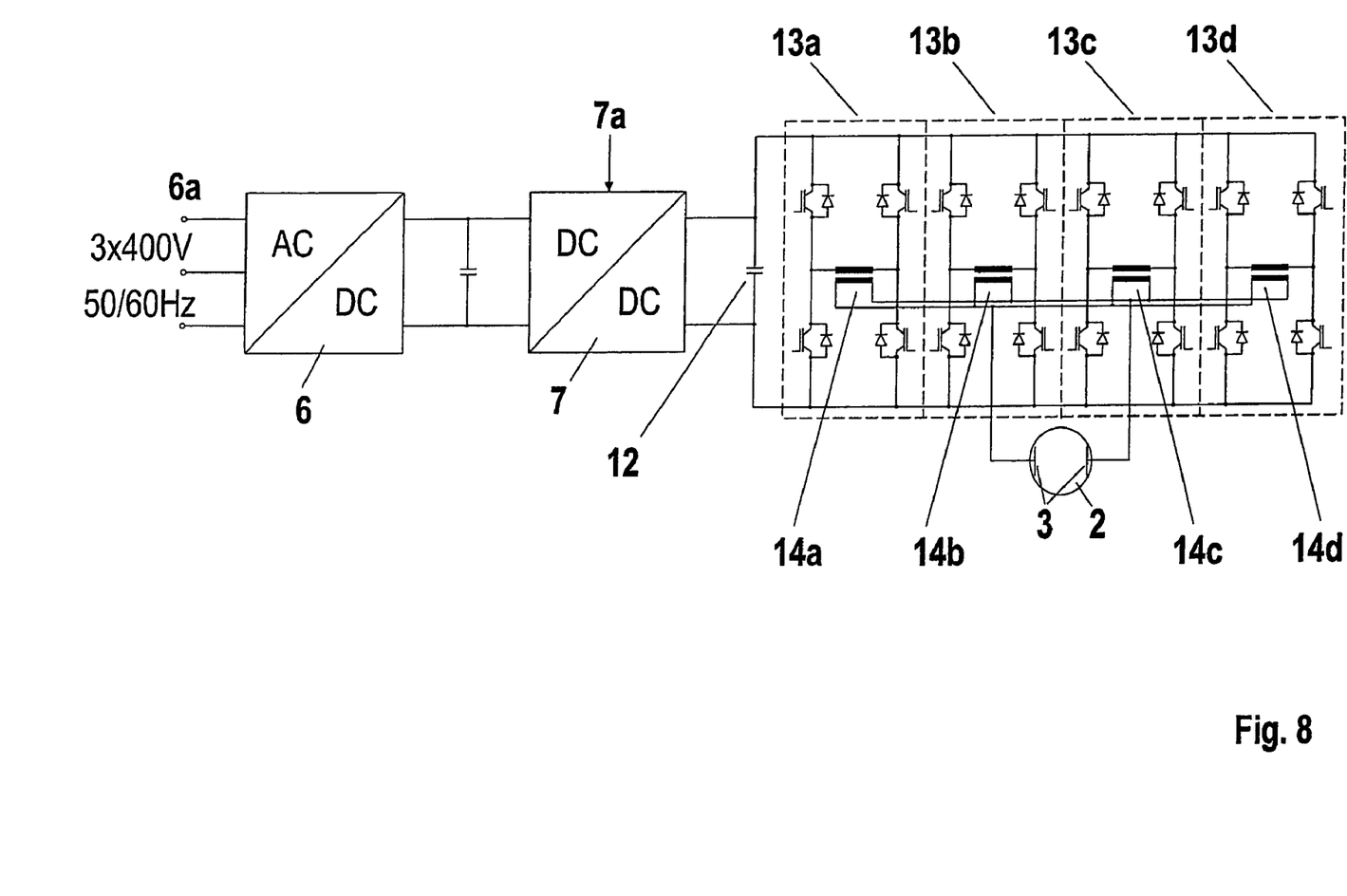

By attaining the desired very high output powers above 50 kW a further parallel connection of bridges, compared to the example of FIG. 7, is advantageous, since the current loading in the individual transistors can therewith be further reduced. Such a structure is shown by example in FIG. 8, in which four such bridge circuits 13a to 13d are employed. For good decoupling, in this example for each bridge one transformer 14a to 14d each is provided and at the secondary side connected together at the output. As already stated, the use of only one transformer 14 is feasible.

The use of IGBTs as switches is of advantage in a frequency range of 1 to 50 kHz, since these within the prior art can switch a sufficiently high current with the parallel connection of two bridges. To attain a frequency range of 50 to 500 kHz, instead of the IGBTs, so-called MOSFETs, should be used, since these can switch faster. Of disadvantage when using MOSFETs is their capability of switching lower currents, such that several MOSFETs must be connected in parallel. An increase of the switching frequency with unchanged pulse switch-on width, thus a reduction of the interspace time, can also be attained through the addition of an additional bridge and alternating driving, as has already been discussed in FIG. 5.

Figure 9:
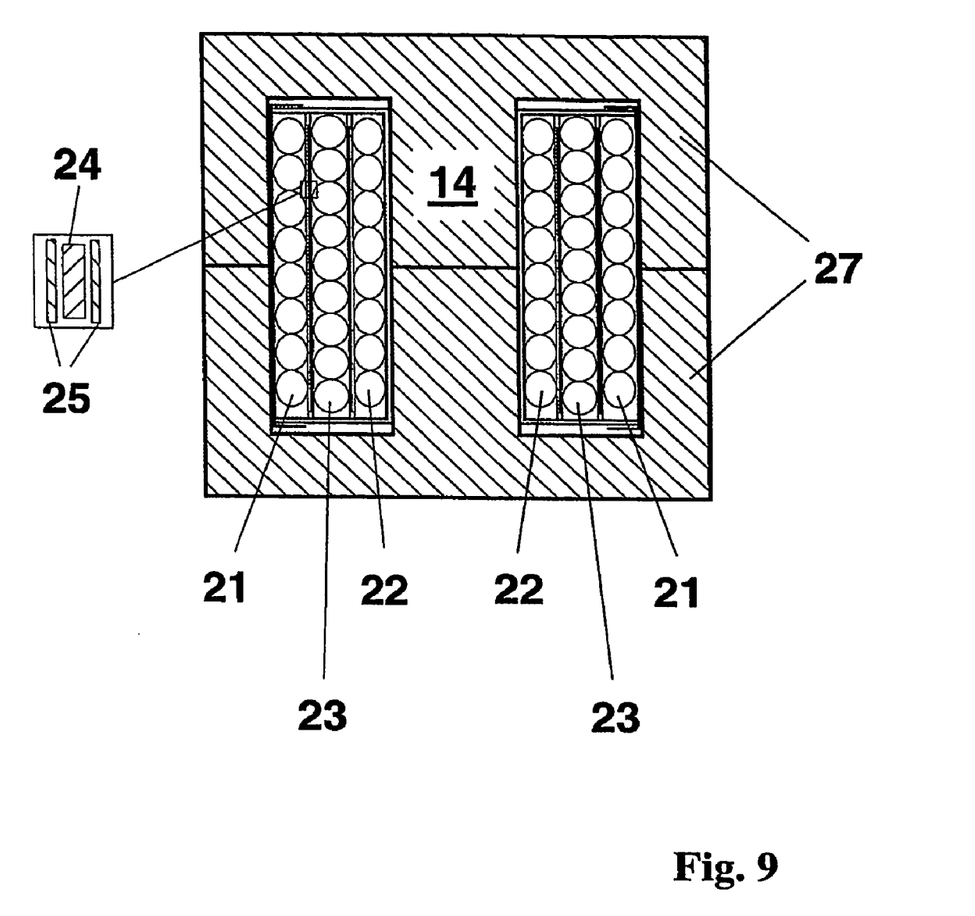

The transformer 14 plays a significant role for the function of the configuration according to the invention. In order to be able to attain the required behavior, it is absolutely necessary that the leakage inductance of transformer 14 is kept as low as feasible. Transformer 14 should be laid out such that this leakage inductance is in every case less than 50 µH, or, even better, less than 10 µH. This requires that the transformation ratios are small, which the present generator concept makes possible. The transformation ratio should not be more than 1:2 or even better be less than 1:1.5. The core material 27 in the case of the present frequencies is fabricated of ferrite and is combined of several cores 27, in order to reach the necessary core volume. For a typical embodiment example of a generator configuration according to the invention with an operating frequency of 25 to 50 kHz and a transferred power of 50 kW the following transformer implementation was realized:

The core 27 is comprised of ferrite material, with nine pieces being arranged one after the other as E-core pairs 80/38/20.

The transformation ratio of the winding was 8:9 windings. The primary voltage was settable from 0 to 725 V (amplitude) and the primary current 0 to 170 A (amplitude) at converter 7, the rectifier mean value of the current was 0 to 36 A. The copper resistance at the primary side was approximately 7 mOhm at 100° C. and at the secondary side approximately 15 mOhm at 100° C. and the leakage inductance, measured at the primary side, corresponded to approximately 2 µH. To attain the low leakage, two parallel-connected primary windings 21, 22 were disposed symmetrically in the winding window to the secondary winding 23, thus they were interleaved. Potentially occurring displacement currents between primary and secondary side are carried off by the screen sheets 24 between the windings, which [sheets] are disposed between insulating sheets 25. This implementation of the transformer winding is depicted in cross section in FIG. 9.

The interspace time between two successive pulses is conventionally in the range of a few microseconds, but can be reduced to a minimum of 0.5 µs. This time should be allowed to pass before the transistors are opened again in order to avoid potential shortcircuits between the two switching transistors.

Figure 10:
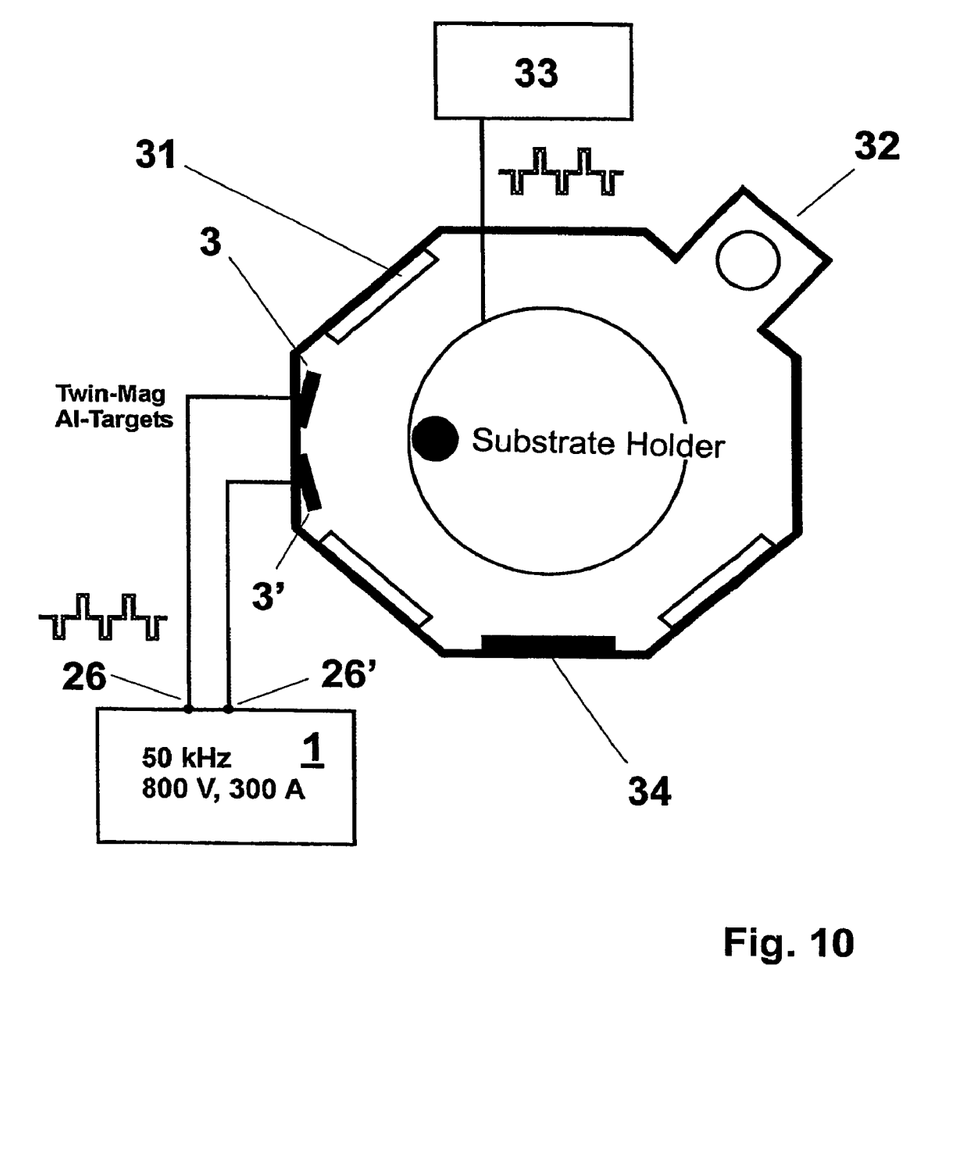

It is known that for the ignition of the plasma a voltage superelevation is necessary, which the generator alone does not deliver without additional measures. Either additional plasma ignition devices can be employed or an LC section can be disposed at the output of the generator or be developed as a parasitic configuration, whereby via a resonant voltage increase on the formed oscillator circuit an ignition voltage is attained during the starting. After the ignition has taken place, the plasma continues to burn without additional measures even during the pulse interspaces. As has already been described, the generator according to the invention is specifically suitable for the production of reactive layers with the aid of vacuum sputtering processes. In particular, if poorly conducting layers or even dielectric layers are to be reactively sputtered from the metallic target, it is feasible with the present generator to realize layers of high quality under the production conditions. The generator is especially suitable for those reactive applications, in which special crystalline layer properties are demanded. This applies in particular with materials such as $SiO_2$, $ZrO_2$ and $Al_2O_3$. Especially with $Al_2O_3$, which may occur in different crystalline modifications, the generator according to the invention makes feasible realizing a process management which selectively permits the preferred crystalline modification. Especially for the application of hard material layers in wear-and-tear protection applications, where special hard layers with degrees of hardness greater than 2200 HK are necessary, the generator according to the invention can be employed with advantage. It was possible with the present generator to deposit in a vacuum coating installation crystalline aluminum oxide selectively with the aid of magnetron sputtering. As the coating installation a commercial installation with the designation BAI 1200, Balzers, Liechtenstein was used (U.S. Pat. No. 5,709,784). FIG. 10 depicts schematically and in cross section the installation configuration used. Two rectangular magnetron cathodes 3, 3' were employed with targets of aluminum with high purity of 99.9995% and an area of 430 mm² each. The two magnetron sputter sources 3, 3' are disposed closely adjacent next to one another on a flange and each tilted at an angle of 15° one with respect to the other. Both cathodes are electrically insulated and connected to the two outputs 26, 26' of the generator. Consequently, in each instance one of the targets is switched as cathode, while at the same time interval the other target was cross-switched as anode. According to the electrical implementation of the generator, during the pulse interspace the two cathodes were electrically shortcircuited against one another. The typical values realized for the embodiment example for the generator were again summarized for an overview in Table 1. Listed are here also in comparison the significantly realizable values for this process technique.

Figure 11:
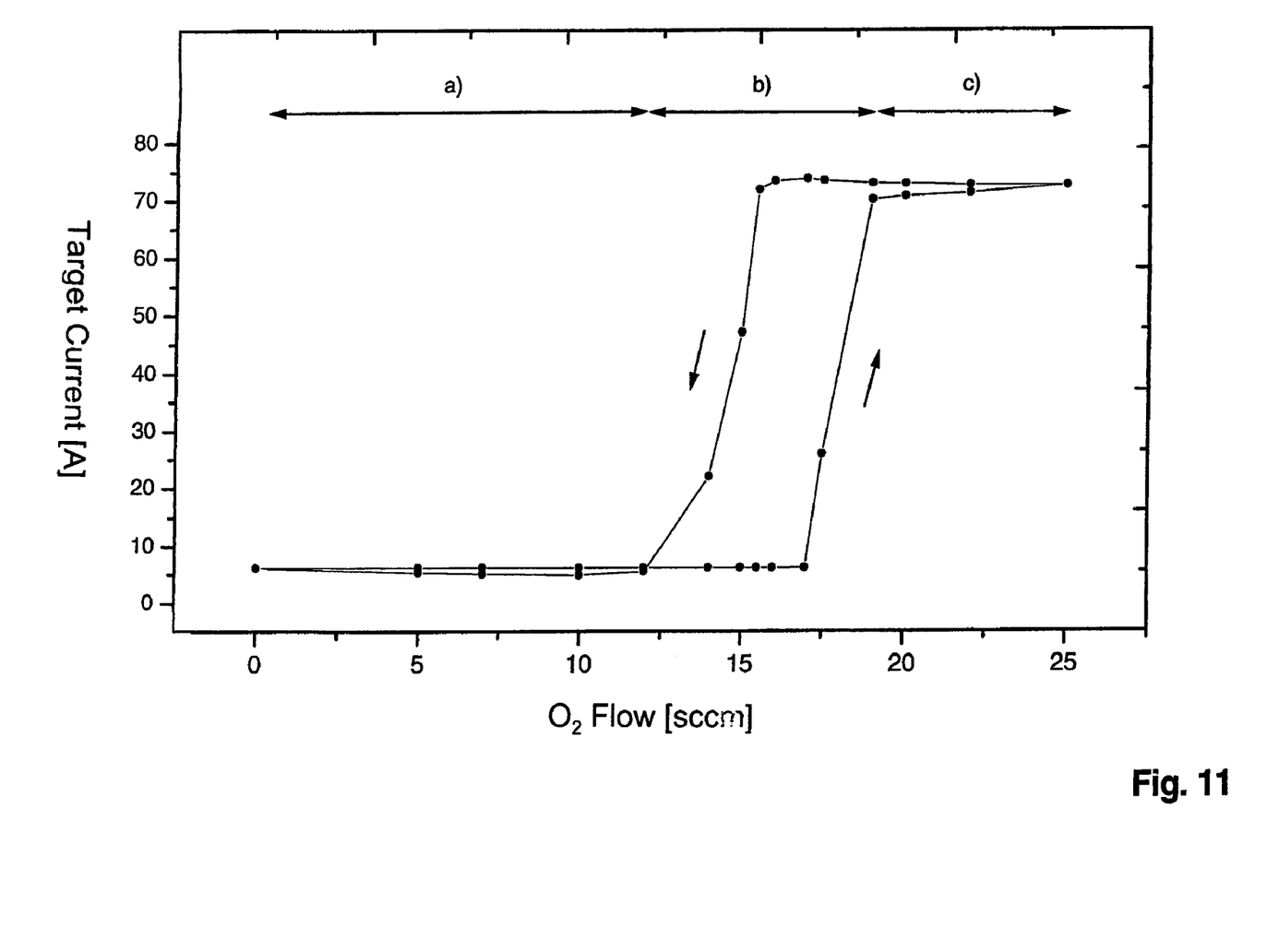

Before the deposition of the layers, first a characteristic was recorded, which, at constant target voltage of 750 V and a current alternating frequency of 42 kHz, at a pulse and interspace time of 6 µs each, represents the target current [A], thus the maximum current flowing across a cathode during one pulse time interval, as a function of the oxygen fraction in the argon oxygen gas mixture. This characteristic represented in FIG. 11 indicates at which starting oxygen fraction $O_2$ in [sccm] in the gas mixture the target is significantly covered with an oxide layer and differentiates the ranges of the metallic mode a), of the transition mode b), and of the oxidic mode c) one from the other at high oxygen fractions. This characteristic depends in detail on the electrical implementation of the generator utilized and of the parameter selection (such as output impedance, voltage, frequency, the installation geometry, the type of gas inlet, the magnetic field behind the cathodes, the pressure, etc.). In order to deposit stoichiometric oxide layers, the process management must at least take place in the transition range. This means the oxygen flow must at least be so high that the target surface starts being covered with an oxide layer. This leads to an increased target current through the greater number of generated secondary electrons of the oxide in comparison to the pure metallic mode. In this case for the deposition of the oxide layer the oxygen flow was regulated by means of a PID regulator to a value such that, due to the degree of oxidation on the target surface, a current value of 50 A resulted. The total pressure of the argon oxygen mixture in such reactive magnetron processes is typically in ranges of $10^{-3}$ to a few $10^{-2}$ mbar.

The coating of the layers crystallized in the gamma phase took place at temperatures about 550° C., an argon oxygen flow ratio of approximately 7:1 and a total pressure around $2.5*10^{-3}$ mbar. During the coating the substrate was disposed at a distance d of 13 cm centrally in front of the two cathodes. To reach the necessary temperatures, a substrate heater 31 can be used in known manner. For the pretreatment of the substrates or of the workpieces, an etching device 32 can be utilized at the installation, in order to improve, for example, the layer adhesion. It is additionally also feasible to carry out the deposition of an adhesion layer with a coating source, such as an arc vaporization source 34 and/or a magnetron sputter source. A further feasibility for affecting or controlling the layer quality consists in utilizing a substrate bias 33, preferably pulsed, for example, with 50 kHz and several KW operating power.

Figure 12:
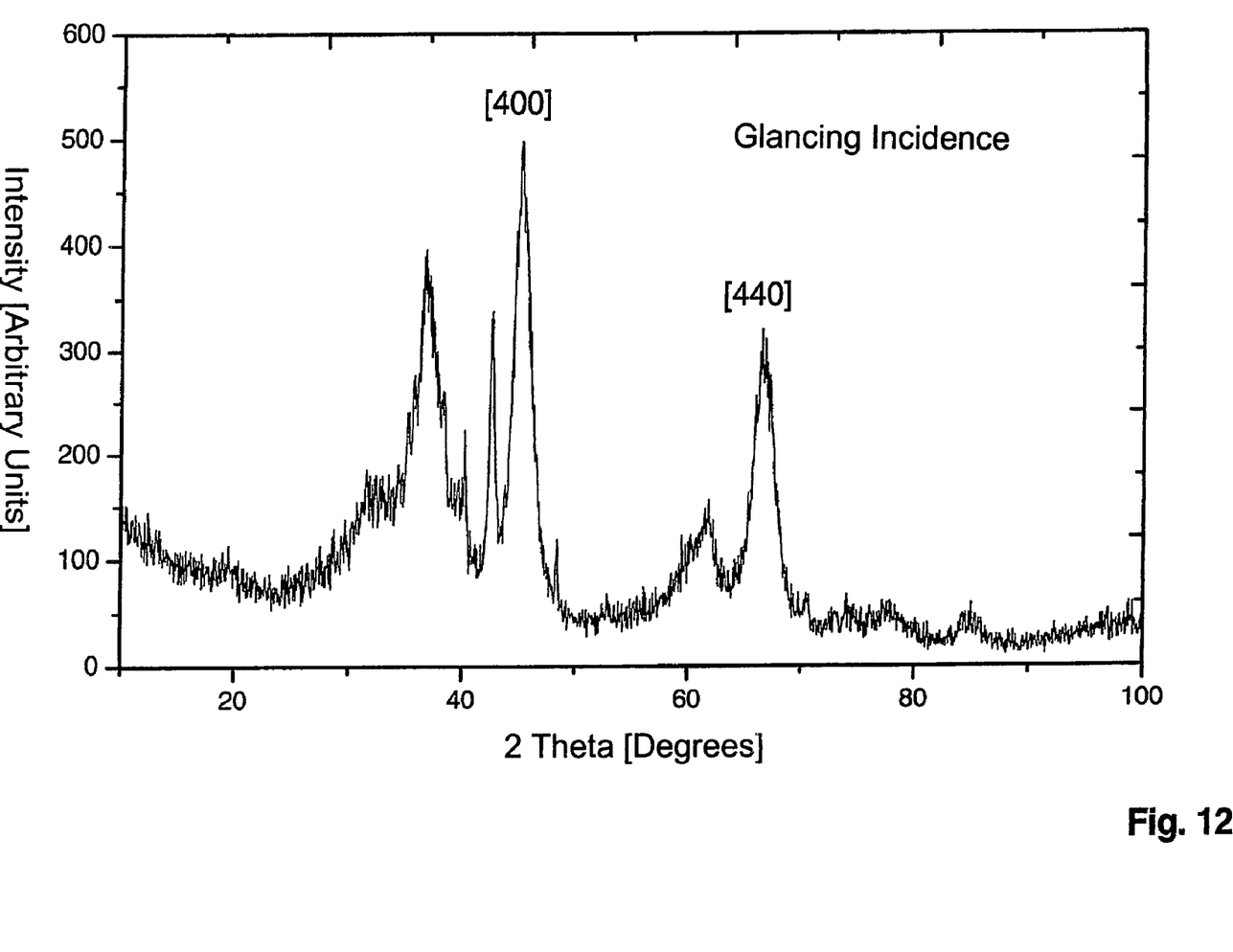

FIG. 12 represents the X-ray diffraction spectrum recorded on a layer crystallized in the gamma phase. Clearly evident are the peaks of the radiation diffracted at the [400] and [440] planes at 45.9 and 67.1°. The hardness of the layer was approximately 2400 HK and consequently corresponded to the expectations published for gamma $Al_2O_3$ layers. Table 2 shows the parameters used in each instance for the deposition of the layers. For applications for protection against wear and tear, high-quality $Al_2O_3$ or $(AlMe)_xO_y$, in particular $(AlCr)_xO_y$ and $(AlFe)_xO_y$, crystallized in the gamma as well as also in the alpha phase, could be deposited. In Table 3 total and preference ranges are listed, in which the depositions of the gamma phase and the alpha phase of $Al_2O_3$ is feasible. Since the process must be carried out in the oxidic range, thus at relatively high $O_2$ flows or partial pressures, regions outside of the sputter trough on the target oxidize, such that local electrical charging on the target surface occurs. These chargings would make an orderly process management impossible. But the generator according to the invention is capable of reducing these chargings and to ensure constant process conditions. In addition, it is possible in the case of severe discharges to blank them out briefly without drastically disturbing the process or destroying the generator. After all, during the process management a maximum current of approximately 50 A occurs here and, in the case of extreme situations, up to more than 300 A at frequencies of 50 kHz.

TABLE 1

|  | Voltage [V] | Current peak [A] | Pulse [µs] | Pulse interspace [µs] | Frequency [kHz] |
| --- | --- | --- | --- | --- | --- |
| realized | 0 to 800 | 300 | ≧5 | ≧5 | ≦50 |
| significantly realized | 0 to 5000 | 600 | ≧2 | >0 | ≦200 |

*) not all limit values can be realized simultaneously

TABLE 2

| $Al_2O_3$ crystal | P [mbar] | V [kHz] | T [°C.] | U [V] | I [A] | Ar [sccm] | $O_2$ [sccm] | Bias [V] |
|---|---|---|---|---|---|---|---|---|
| Gamma | $2.5\ 10^{-3}$ | 42 | 550 | 750 | 50 | 100 | 14.5 | 50 bp*[)] |
| Alpha | $4.4\ 10^{-3}$ | 25 | 800 | 800 | 30 | 94 | 8 | float |

*[)]bipolar pulse 50 kHz

TABLE 3

| $Al_2O_3$ crystal | V [kHz] | T [°C.] | U [V] | Ar [sccm] | $O_2$ [sccm] | Bias [V] |
|---|---|---|---|---|---|---|
| gamma | 10-100 | 400-600 | 500-1000 | Var.[1)] | var.[1)] | 0-200[2)] |
| alpha | 10-100 | 600-800 | 500-1000 | Var.[1)] | var.[1)] | 0-200[2)] |

[1)]variable depending on hysteresis, preferably in the transition range or oxidic range
[2)]settable 0-200 V, preferred 50-150 V for the adaptation of the microstructure, density and adhesion With the generator according to the invention it was consequently possible to deposit reliably aluminum oxide in the gamma phase in a temperature range of 400 to 600° C. The gamma $Al_2O_3$ can especially advantageously be employed in hard material applications, since at the relatively low temperatures, which are still below the tempering temperatures of various steels, such as for example HSS, it is also possible to coat steel bodies without negatively affecting the steel substrate. It was even possible to deposit alpha $Al_2O_3$ with the present generator, however, at minimally higher temperatures in the range of 600 to 800° C. The capability of being able to deposit such qualitatively superior and hard $Al_2O_3$ layers will probably open new applications in the hard material field. The use of the generator according to the invention is moreover not only promising for this field but rather especially also in all fields where sensible reactive processes are to be realized.

The invention claimed is:

1. A plasma treatment arrangement for treating a workpiece, the arrangement comprising:
a vacuum process chamber (2) for receiving workpieces and for containing a plasma discharge for treating the workpieces, the chamber having two electrodes (3) that are spaced from each other in the chamber with the plasma discharge between the electrodes; and
a vacuum plasma generator with two outputs (26, 26') that are directly connected respectively to the two electrodes (3) for feeding a plasma discharge for the treatment of workpieces in the vacuum chamber, the generator comprising:
a converter (7) having a DC voltage output, a DC input, a control input (7a) and a converter transformer (17) for at least one of setting and regulating an output DC voltage of the converter as a low-level and as a high-level setter for adjusting the DC voltage output to be an adjustable DC voltage,
a mains connection (6a) for the junction to an AC voltage mains,
a mains rectifier (6) connected to the mains connection (6a) and connected to the DC input of the converter (7), and
a controlled full bridge circuit (13) connected to the converter DC voltage output, the bridge circuit having the two outputs (26, 26') that are each a potential-free generator output (26, 26'), which transposes the adjustable DC voltage output of the converter into pulses of 1 to 500 kHz, and, in the bridge circuit (13) a potential-isolating transformer (14) is included for galvanic decoupling of the generator outputs (26, 26'),
the converter transformer (17) located upstream of the potential-isolating transformer (14) in the vacuum plasma generator so that the potential-isolating transformer (14) is located downstream of the converter transformer (17) in the generator,
the potential-isolating transformer (14) having at least one primary winding connected to the bridge circuit and at least one secondary winding having two connections, the two connections consist only of respective lines from the secondary winding being respectively and directly connected by said respective lines only to the two outputs (26, 26') which are respectively and directly connected only by said lines to the two electrodes (3) to short circuit the electrodes via the secondary winding and for galvanic decoupling of the two outputs so that a bipolar voltage at the secondary winding of the potential-isolating transformer is transferred to the electrodes so that the electrodes operated with alternating polarity so that one electrode operates as a cathode while the other electrode operated as an anode in a periodically alternating fashion for inhibiting charges on surfaces of the electrodes caused by reversing of polarity at the electrodes and for the creating of short circuiting of the electrodes during repeated zero crossings of the bipolar voltage, a voltage transformation ratio of the bridge circuit (13) with the potential-isolating transformer (14) being maximally 1:2.

2. The plasma treatment arrangement as claimed in claim 1 wherein the voltage transformation ratio of the bridge circuit (13) with the potential-isolating transformer (14) is maximally 1:1.5.

3. The plasma treatment arrangement as claimed in claim 1, wherein the potential-isolating transformer (14) has a leakage inductance below 50 µH.

4. The plasma treatment arrangement as claimed in claim 1, wherein the converter (7) is a clocked converter for setting an output voltage, which is lower as well as also higher than the input voltage.

5. The plasma treatment arrangement as claimed in claim 1, wherein the bridge circuit (13) generates bipolar pulses.

6. The plasma treatment arrangement as claimed in claim 1, wherein the bridge circuit (13) comprises control means for one of setting and regulation of pulse behavior of the bridge circuit, the duty factor, the pulse width and for setting the pulse curve form for the bridge circuit.

7. The plasma treatment arrangement as claimed in claim 1, wherein the bridge circuit (13) forms a pulse interspace between successive pulses.

8. The plasma treatment arrangement claimed in claim 7, wherein the bridge circuit (13) short circuits the potential-isolating transformer (14) at the primary winding during pulse interspaces.

9. The plasma treatment arrangement as claimed in claim 1, wherein at least two bridge circuits (13) are connected succeeding the converter (7).

10. The plasma treatment arrangement as claimed in claim 9, wherein four bridge circuits are connected succeeding the converter (7).

11. The plasma treatment arrangement as claimed in claim 9, wherein to each bridge circuit (13) a potential-isolating transformer (14) is assigned and the secondary windings of the potential-isolating transformers (14) are connected in parallel.

12. The plasma treatment arrangement as claimed in claim 9, wherein the bridge circuits (13) are switched offset in phase.

13. Method for the production of a layer by reactive deposition out of a plasma, wherein the plasma is operated with the arrangement as claimed in claim 1.

14. Method as claimed in claim 13, wherein the generator output (26, 26') is connected with two deposition electrodes (3) comprising the two spaced apart electrodes in the vacuum process chamber.

15. Method as claimed in claim 13, wherein dielectric layers are deposited reactively.

16. Method as claimed in claim 13, wherein the layers deposited by sputtering.

17. Method as claimed in claim 13, wherein the layer is a reactively deposited metal oxide layer $Me_xO_y$.

18. Method as claimed in claim 17, wherein the hard material layer is an $Al_2O_3$ layer.

19. Method as claimed in claim 17, wherein the hard material layer is a mixed oxide.

20. Method as claimed in claim 13, wherein the crystalline structure of the layer comprises substantially at least one of an alpha phase and a gamma phase.

* * * * *